(12) United States Patent  
Jie

(10) Patent No.: US 8,648,440 B2  
(45) Date of Patent: Feb. 11, 2014

(54) SEMICONDUCTOR DEVICE EMPLOYING NITRIDE FLOATING CAPACITOR (NFC)

(75) Inventor: Seok-Ho Jie, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 244 days.

(21) Appl. No.: 12/829,837

(22) Filed: Jul. 2, 2010

(65) Prior Publication Data

US 2011/0156206 A1 Jun. 30, 2011

(30) Foreign Application Priority Data

Dec. 30, 2009 (KR) .......................... 10-2009-0134228

(51) Int. Cl.
 *H01L 21/02* (2006.01)
(52) U.S. Cl.
 USPC .................................. 257/532; 257/E29.342
(58) Field of Classification Search
 USPC .......................................... 257/532, E29.342
 See application file for complete search history.

(56) References Cited

U.S. PATENT DOCUMENTS

| 6,365,928 B1* | 4/2002 | Yang et al. ..................... 257/296 |
| 7,723,202 B2* | 5/2010 | Eto ................................ 438/396 |
| 2004/0053463 A1* | 3/2004 | Matsumura ................... 438/241 |
| 2010/0127317 A1* | 5/2010 | Yamazaki ..................... 257/306 |

FOREIGN PATENT DOCUMENTS

| KR | 100533959 | 12/2005 |
| KR | 10-2006-0007727 | 1/2006 |
| KR | 10-2009-0001005 | 1/2009 |
| KR | 10-2009-0052661 | 5/2009 |

OTHER PUBLICATIONS

Notice of Preliminary Rejection issued from Korean Intellectual Property Office on Mar. 28, 2011.
Notice of Allowance issued from Korean Intellectual Property Office on Nov. 30, 2011.

* cited by examiner

*Primary Examiner* — David Vu
*Assistant Examiner* — Brandon Fox
(74) *Attorney, Agent, or Firm* — IP & T Group LLP

(57) ABSTRACT

A semiconductor device includes: a substrate configured to include cell regions and a peripheral region around the cell regions; storage nodes arranged in each of the cell regions; a first support pattern configured in each cell region to support the storage nodes; and a second support pattern configured in the peripheral region to couple first support patterns to each other.

11 Claims, 5 Drawing Sheets

SEMICONDUCTOR DEVICE EMPLOYING NITRIDE FLOATING CAPACITOR (NFC)

CROSS-REFERENCE TO RELATED APPLICATIONS

The present application claims priority of Korean Patent Application No. 10-2009-0134228, filed on Dec. 30, 2009, which is incorporated herein by reference in its entirety.

BACKGROUND OF THE INVENTION

Exemplary embodiments of the present invention relate to a technology for fabricating a semiconductor device, and more particularly, to a semiconductor device employing a nitride floating capacitor (NFC).

As the size of a semiconductor memory device is required to shrink, cell size also shrinks and the area occupied by a capacitor is decreased as well. However, since capacitors having high capacitance are required to drive a semiconductor device, researchers are developing technology for securing capacitors having high capacitance.

In order to fabricate capacitors having high capacitance, the surface area of a storage node may be expanded or a dielectric layer having a high dielectric constant may be used. When a dielectric layer having a high dielectric constant is used, the stability of conventional processes and reliability work as limitations in the application to a semiconductor device fabrication process. Since the problems hold back the application to the semiconductor device fabrication process, the method of expanding the surface area of a storage node may be desirable. Capacitors for expanding the surface of a storage node include a stack-type capacitor, a concave-type capacitor, a pin-type capacitor, a cylinder-type capacitor and so forth.

Recently, a capacitor has been proposed having a structure where a supporter is applied to a cylinder-type capacitor to maximize the surface area of a storage node. The supporter is a stable structure that can prevent a storage node from leaning down due to the surface tension generated during a dip-out process.

FIGS. 1A and 1B show a conventional capacitor using a supporter. FIG. 1A is a plan view of the conventional capacitor, and FIG. 1B is a photograph showing a sectional view of a capacitor having a structure using a supporter cut along a line X-X' in FIG. 1A.

Referring to FIGS. 1A and 1B, the cylinder-type storage nodes 11 are formed in plural, and a supporter 12 is formed in the upper portion of the storage nodes. Herein, a structure using a nitride layer as the supporter 12 is referred to as a nitride floating capacitor (NFC).

The conventional capacitor where the storage node 11 is fixed by the supporter 12 has a stable structure that can increase the capacitance of a capacitor by increasing the vertical height of the capacitor and expanding the surface area of the storage node 11, and prevent the storage node 11 from leaning down due to the surface tension generated during a subsequent dip-out process.

However, since the supporter 12 is formed to support the storage node 11 of one cell region in a conventional semiconductor device, there is a concern in that the leaning phenomenon occurs after the dip-out process performed of each cell region.

SUMMARY OF THE INVENTION

An exemplary embodiment of the present invention is directed to a semiconductor device that may prevent a leaning phenomenon from occurring in each cell region during a dip-out process.

In accordance with an exemplary embodiment of the present invention, a semiconductor device includes: a substrate configured to include a plurality of cell regions and a peripheral region arranged around the plurality of cell regions, a plurality of storage nodes arranged in each of the cell regions, a first support pattern configured in each cell region to support the plurality of storage nodes, and a second support pattern configured in the peripheral region to couple first support patterns to each other.

In accordance with another exemplary embodiment of the present invention, a semiconductor device includes: a substrate configured to include a plurality of cell regions and a peripheral region arranged around the plurality of cell regions, a plurality of storage nodes arranged in each of the cell regions, a conductive layer arranged in the peripheral region, a first support pattern configured in each cell region to support the plurality of storage nodes, and a second support pattern configured in the peripheral region to couple first support patterns to each other and including an aperture defining a region to accommodate a plug coupled to the conductive layer.

DESCRIPTION OF EXEMPLARY EMBODIMENTS

Figure 1A:
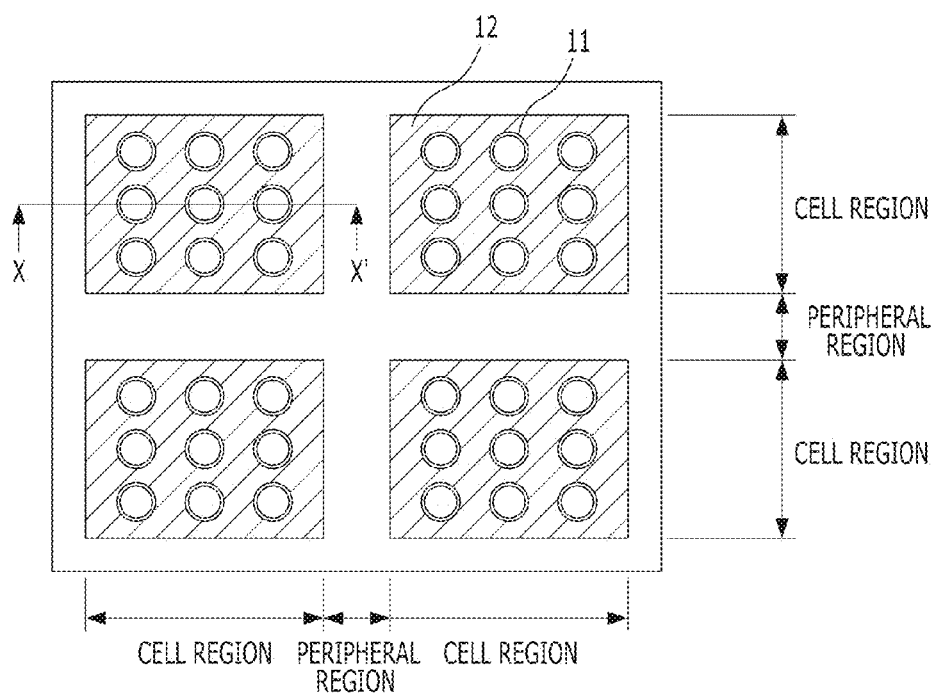
FIGS. 1A and 1B show a conventional capacitor using a supporter.
Figure 1B:
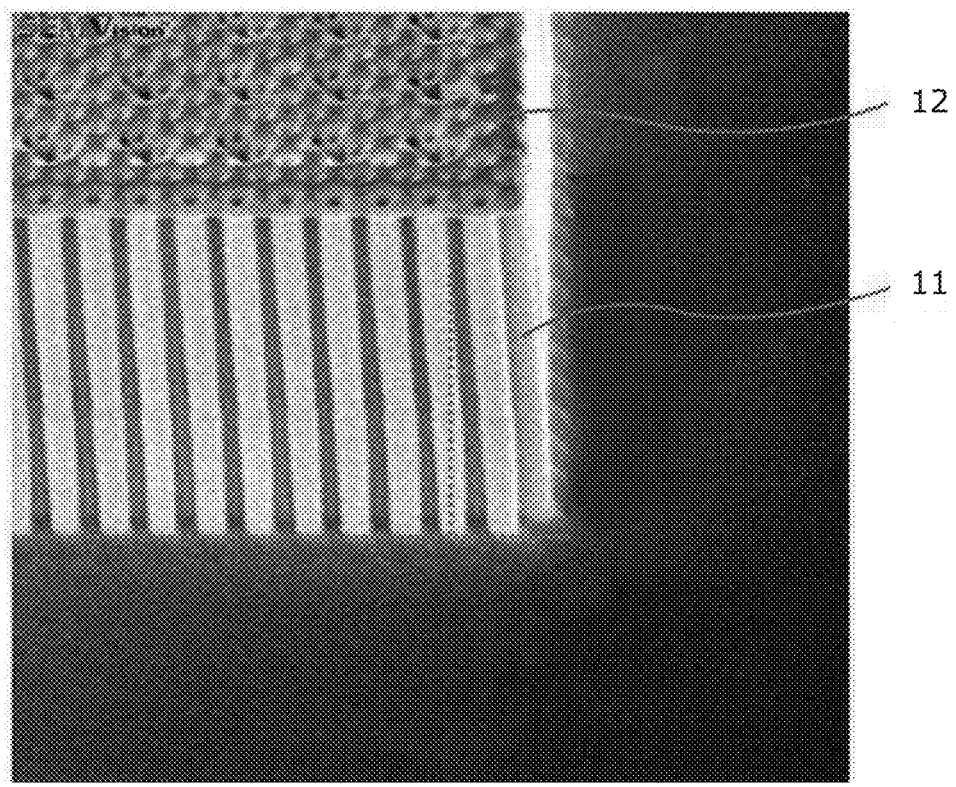

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention, which will be described hereafter, provide a semiconductor device that can prevent a leaning phenomenon from occurring in each cell region during a dip-out process. To this end, a semiconductor device fabricated according to one embodiment of the present invention includes first patterns supporting storage nodes in cell regions and second support patterns coupling the first support patterns to each other.

Figure 2A:
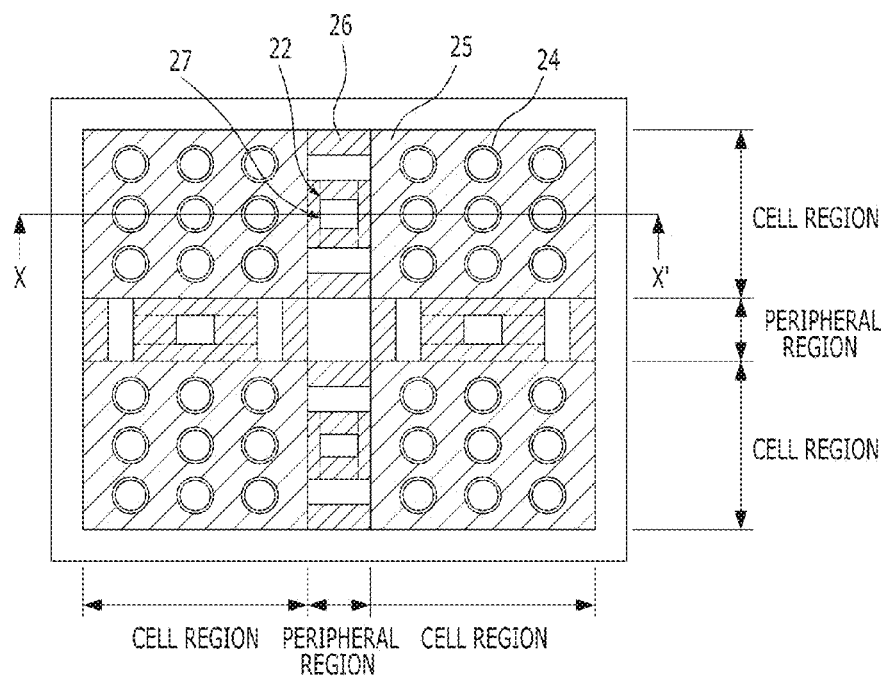
FIGS. 2A and 2B illustrate a semiconductor device in accordance with one embodiment of the present invention.
Figure 2B:
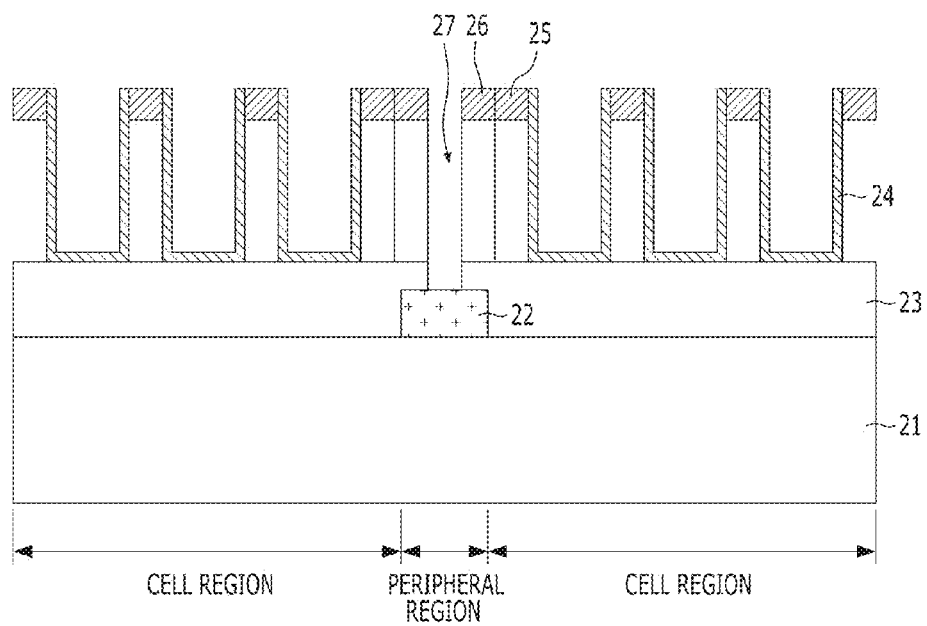

FIGS. 2A and 2B illustrate a semiconductor device in accordance with one embodiment of the present invention. FIG. 2A is a plan view of the semiconductor device, and FIG. 2B is a cross-sectional view illustrating the semiconductor device cut along a line X-X' shown in FIG. 2A.

Referring to FIGS. 2A and 2B, the semiconductor device includes a substrate 21 including a plurality of cell regions and a peripheral region around the cell regions, a plurality of storage nodes 24 formed in each cell region, a first support pattern 25 formed in each cell region to support the storage nodes 24, and a second support pattern 26 formed in a peripheral region to couple first support patterns 25 to each other.

The storage nodes 24 may be cylinder-type storage nodes. For the sake of convenience in description, the drawing shows an example where the storage nodes 24 are arranged in a 3×3 matrix form in one cell region. However, in an actual semiconductor device, hundreds to thousands storage nodes 24 may be arranged in a matrix form in one cell.

The first support pattern 25 prevents the storage nodes 24 from leaning down due to the surface tension generated during a dip-out process, and the first support pattern 25 may be formed as an insulation layer. A structure where the first support pattern 25 is formed of a nitride layer is generally called a nitride floating capacitor (NFC) structure.

The second support pattern 26 coupling the first support patterns 25 prevents a leaning phenomenon from occurring in each cell region including the first support pattern 25 after a dip-out process.

The second support pattern 26 may be positioned on the same plane as the first support patterns 25 and the second support pattern 26 may be formed of the same material as that of the first support pattern 25. In other words, the second support pattern 26 may be formed simultaneously when the first support patterns 25 are formed.

With the second support pattern 26 coupling the first support patterns 25, the technology of the present invention can prevent a leaning phenomenon from occurring in each cell region after a dip-out process.

Figure 3A:
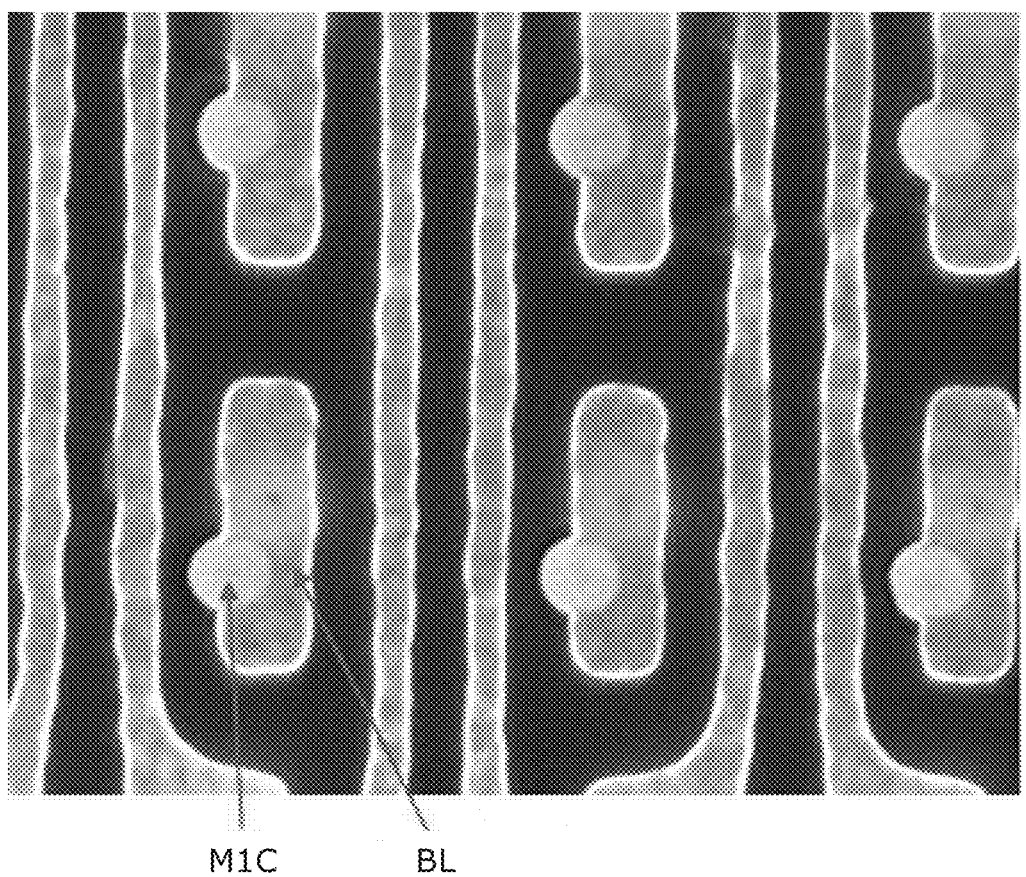
FIGS. 3A and 3B are photographs showing an alignment relationship between bit lines and plugs.
Figure 3B:
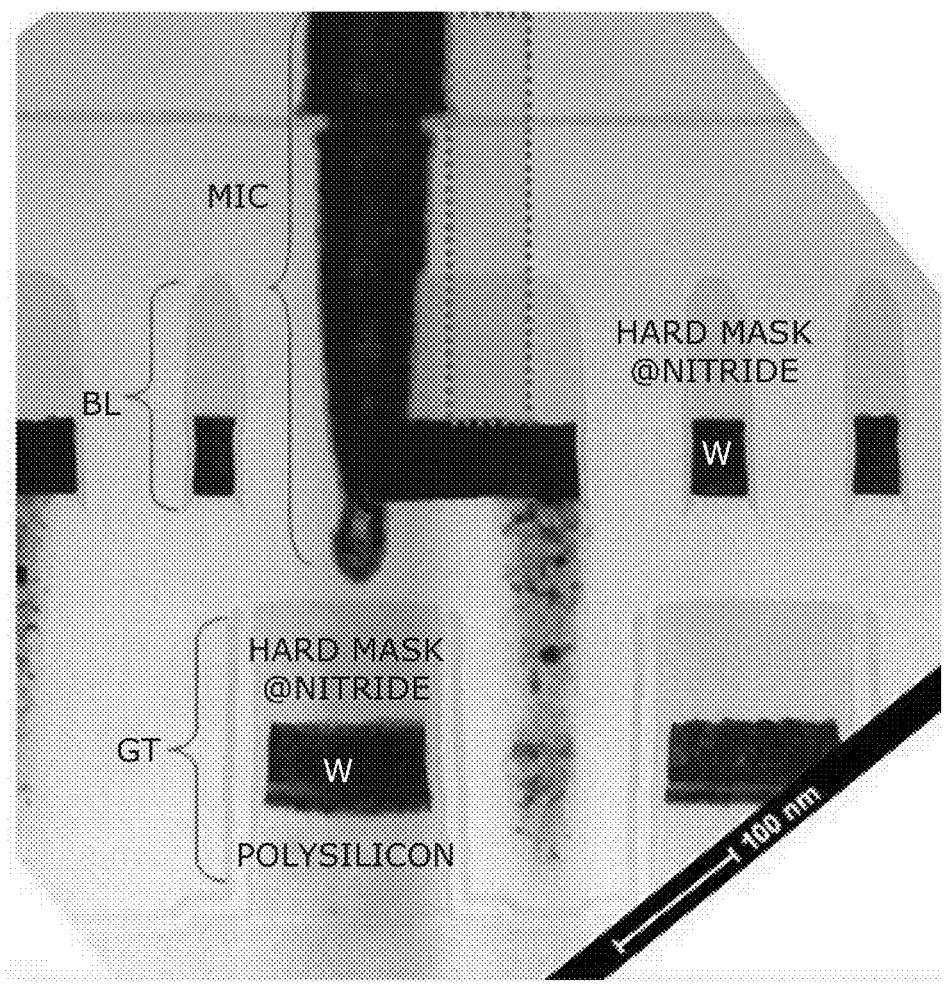

In addition, the semiconductor device according to one embodiment of the present invention can resolve the problem of misalignment caused when plugs having a high aspect ratio are formed in the peripheral region, e.g., M1C, as illustrated in FIGS. 3A and 3B.

FIGS. 3A and 3B are photographs showing an alignment relationship between bit lines and plugs.

Referring to FIGS. 3A and 3B, plugs M1C, which are to be formed over bit lines BL, go down to gates GT under the bit lines BL due to misalignment occurring during a plug formation process and a short occurs between the plugs M1C and the gates GT, which is is problematic. The problem is not detected during an overlay measurement performed after a plug mask and contact holes for the plugs M1C are formed, but a failure originating from the short between the plugs M1C and the gates GT is detected during a probe-test, which is performed after fab-out.

However, as illustrated in FIGS. 2A and 2B, since the second support pattern 26 formed in the peripheral region and coupling the first support patterns 25 includes openings 27, which define a conductive layer 22 formed over the substrate 21 under the storage nodes 24, that is, a region where a plug MIC coupled to a bit line BL is to be formed, the problem originating from the misalignment during the plug formation process can be resolved.

As described above, with the second support pattern 26 coupling the first support patterns 25, the semiconductor device according to one embodiment of the present invention prevents a leaning phenomenon from occurring in each cell region and simultaneously resolves a problem originating from the misalignment during the formation of plugs M1C in the peripheral region.

While the present invention has been described with respect to exemplary embodiments, it will be apparent to those skilled in the art that various changes and modifications may be made without departing from the spirit and scope of the invention as defined by the following claims.

What is claimed is:

1. A semiconductor device, comprising:
   a substrate configured to include a plurality of cell regions and a peripheral region arranged around the plurality of cell regions;
   a plurality of storage nodes arranged in each of the cell regions;
   a first support pattern configured in each cell region to support the plurality of storage nodes; and
   a second support pattern configured in the peripheral region to couple first support patterns to each other,
   wherein the first support patterns of neighboring cell regions are coupled by the second support pattern formed in the peripheral region between the neighboring cell regions.

2. The semiconductor device of claim 1, wherein the first support patterns and the second support pattern are positioned on the same plane.

3. The semiconductor device of claim 1, wherein the first support patterns and the second support pattern are of an identical material.

4. The semiconductor device of claim 1, wherein the first support patterns and the second support pattern each include a nitride layer.

5. A semiconductor device, comprising:
   a substrate configured to include a plurality of cell regions and a peripheral region arranged around the plurality of cell regions;
   a plurality of storage nodes arranged in each of the cell regions;
   a conductive layer arranged in the peripheral region;
   a first support pattern configured in each cell region to support the plurality of storage nodes; and
   a second support pattern configured in the peripheral region to couple first support patterns to each other and including an aperture defining a region to accommodate a plug coupled to the conductive layer,
   wherein the first support patterns of neighboring cell regions are coupled by the second support pattern formed in the peripheral region between the neighboring cell regions.

6. The semiconductor device of claim 5, wherein the first support pattern in each cell region is formed to surround the plurality of storage nodes.

7. The semiconductor device of claim 5, wherein the first support patterns and the second support pattern are positioned on the same plane.

8. The semiconductor device of claim 5, wherein the first support patterns and the second support pattern are of an identical material.

9. The semiconductor device of claim 8, wherein the first support patterns and the second support pattern each include a nitride layer.

10. The semiconductor device of claim 5, wherein the conductive layer includes a bit line.

11. The semiconductor device of claim 1, wherein the first support pattern in each cell region is formed to surround the plurality of storage nodes.

* * * * *